United States Patent [19]
Agata et al.

[11] Patent Number: 5,825,146
[45] Date of Patent: Oct. 20, 1998

[54] MOTOR DRIVE DEVICE

[75] Inventors: Hiromichi Agata, Anjo; Yoshihiko Minatani, Kariya; Akira Suzuki, Obu; Yutaka Hotta, Chiryu, all of Japan

[73] Assignee: Aisin AW Co., Ltd., Anjo, Japan

[21] Appl. No.: 865,932

[22] Filed: May 30, 1997

[30] Foreign Application Priority Data

May 31, 1996 [JP] Japan ..................................... 8-138547

[51] Int. Cl.$^6$ ................................ H05K 1/18; H02P 7/29
[52] U.S. Cl. .......................... 318/439; 318/558; 361/777; 428/901
[58] Field of Search ..................................... 318/558, 439; 388/907, 915; 361/748, 760, 761, 763, 777; 428/901

[56] References Cited

U.S. PATENT DOCUMENTS 5,023,684   6/1991   Tsunoda .
5,194,933   3/1993   Miyagi .

*Primary Examiner*—Bentsu Ro
*Attorney, Agent, or Firm*—Oliff & Berridge, PLC

[57] ABSTRACT

A motor drive device including a substrate, a control unit packaged over the substrate for generating a pulse width modulation signal; insulation means packaged over the substrate, a gate drive circuit packaged over the substrate and connected through the insulation means with the control unit for generating a transistor drive signal in response to the pulse width modulation signal coming from the control unit, and an inverter including a plurality of transistors for generating a phase current by turning ON/OFF the transistors in response to the transistor drive signal coming from the gate driver circuit. A wiring pattern and a substrate ground are formed at the side of the substrate closer to the control unit. Only the wiring pattern is formed at the side of the substrate closer to the gate drive circuit.

12 Claims, 8 Drawing Sheets

MOTOR DRIVE DEVICE

BACKGROUND OF THE INVENTION

1. Field of Invention

The invention relates to a motor drive device.

2. Description of Related Art

A prior art electric car uses a motor consisting of a rotor and a stator coil. The electric car is driven by feeding the stator coil with a phase current controlled by a control unit of a motor drive device.

The control unit is equipped with current command value generating means, current comparing means, pulse width modulation (PWM) signal generating means and triangular-wave generating means. A three-phase sinusoidal signal of U-phase, V-phase and W-phase is generated in the current command in response to a torque. The three-phased sinusoidal signal of the U-phase, V-phase and W-phase correspond to the position of the rotor and is fed as a current command value to the current comparing means.

The current comparing means compares the current command value with the phase current, as fed back from the motor. The deviation of the current command value with the phase current is then sent to the pulse width modulation signal generating means. The pulse width modulation signal generating means compares the inputted difference and a reference triangular-wave, coming from the triangular-wave generating means, to generate a three-phase pulse width modulation signal having an output pulse width corresponding to the current command value. The pulse width modulation signal generating means then sends the pulse width modulation signal to the gate drive circuit.

The gate drive circuit responds to the pulse width modulation signal to generate a transistor drive signal. The transistor drive signal is then sent to an inverter. The inverter has six transistors which are turned ON while the transistor drive signal is ON. The inverter also generates and feeds a three-phase phase current to the stator coil.

A power source unit is connected individually with a control unit and a gate drive circuit. The power source unit applies a control voltage to the control unit and a drive voltage to the gate drive circuit.

FIG. 1 is a circuit diagram showing an essential portion of a motor drive unit of the prior art. An inverter 10 consists of three transistor pairs each having an upstream transistor Tr1 and a downstream transistor Tr2, each connected in series.

The upstream transistor Tr1 and downstream transistor Tr2 generate the three-phase phase current. A gate G and a gate line 12, a collector C and a positive power source line 15, an emitter and an emitter line 13 and a phase winding 14, are individually connected with each other in the upstream transistor Tr1. A gate G and a gate line 12, a collector C, a phase winding 14 and an emitter E, an emitter 13 and a negative power source line 16, are individually connected with each other in the downstream transistor Tr2. The phase winding 14 is connected with the motor (not shown). The positive power source line 15 and the negative power source line 16 are connected with the battery (not shown).

The inverter 10 is driven by a gate drive circuit 11. The gate drive circuit 11 is connected with the individual gates G of the upstream transistor Tr1 and the downstream transistor Tr2 by the individual gate lines 12. This configuration allows the individual transistor drive signals SG1, as generated by the gate drive circuit 11, to be inputted to the individual gates G. Thus, the upstream transistor Tr1 and the downstream transistor Tr2 are turned ON when the transistor drive signals SG1 are raised to a high level. Similarly, the upstream transistor Tr1 and the downstream transistor Tr2 are turned OFF when the transistor drive signals SG1 are lowered to a low level.

The positive phase current is fed to the motor through the phase wiring 14 when the upstream transistor Tr1 is turned ON and the downstream transistor Tr2 is turned OFF. The negative phase current is fed to the motor when the upstream transistor Tr1 is turned OFF and the downstream transistor Tr2 is turned ON.

The gate drive circuit 11 and the control unit (not shown) are connected through a line 18. In this case, a pulse width modulation signal PWM, as generated by the control unit, is sent to the gate drive circuit 11. The gate drive circuit 11 and the control unit are also connected with a power source unit 21 so that a drive voltage $V_D$ and a control voltage $V_C$ are applied to the gate drive circuit 11 and the control unit, respectively.

Because the drive voltage $V_D$ is set at 15 $\{V\}$, the transistor drive signal SG1 takes a voltage of 15 [V] at its high level (compared with the emitter line 13) and −15 [V] at its low level (compared with the emitter line 13). Additionally, because the control voltage $V_C$ is set at 5 [V], the pulse width modulation signal PWM takes a voltage of 5 [V] at its high level and 0 [V] at its low level. Therefore, the pulse width modulation signal PWM may be influenced by the drive voltage $V_D$.

A photocoupler 22 acting as insulation means for insulating the control unit and the gate drive circuit 11 is located between the control unit and the gate drive circuit 11. The photocoupler 22 is composed of a photodiode and a phototransistor (not shown).

FIG. 2 is a perspective view showing a packaged state of a gate drive circuit in the motor drive unit of the prior art. FIG. 3 is a top plan view showing the packaged state of the gate drive circuit in the motor drive unit of the prior art. FIG. 4 is a perspective view showing an essential portion of the substrate in the motor drive unit of the prior art.

The gate drive circuit 11 includes transistors Tr11 and Tr12, an electrolytic capacitor Cl and a gate resistor $R_G$. The transistors Tr11 and Tr12, the electrolytic capacitor C1 and the gate resistor are arranged along the gate line 12. The gate drive circuit further includes transistors Tr13 and Tr14 and an electrolytic capacitor C2. The transistors Tr13 and Tr14 and the electrolytic capacitor C2 are arranged along the emitter line 13. The transistors Tr11 and Tr13 are connected through the photocoupler 22 with the control unit (not shown). As previously described, the inverter has 3 transistor pairs.

The control unit, the gate drive circuit 11 and the power source unit 21 (as shown in FIG. 2) are packaged over a common substrate 23 and are connected with one another by a wiring pattern 24, such as the gate line 12 and the emitter line 13.

A substrate ground 26 is grounded to the earth so that noise is not produced in the pulse width modulation signal PWM, which is sent from the control unit to the gate drive circuit 11. The substrate ground 26 is grounded to the earth by forming the substrate ground 26 of a solid pattern in the surface, e.g., having none of the wiring pattern 24 of the substrate, and by connecting the substrate ground 26 to the casing (not shown). A substrate ground 28 is also grounded to the earth by forming the substrate ground 28 of a solid pattern in the portion, e.g., having none of the wiring pattern (not shown) inside of the substrate 23, and by connecting the substrate ground 28 to the casing.

In the motor drive device of the prior art, however, when the upstream transistor Tr1 and the downstream transistor Tr2 are separately turned ON/OFF, positive and negative potentials at a level corresponding to the battery voltage are alternately established between the gates G and the emitters E. This causes the potential of the emitter line 13 to fluctuate.

A capacitor effect exists between the emitter line 13 and the substrate ground 26 and between the emitter line 13 and the substrate ground 28 as the potentials at the emitter lines 13 fluctuate. This fluctuation is due to the emitter line 13 and the substrate ground 26, and the emitter line 13 and the substrate ground 28 being in close proximity to each other over the substrate 23.

As a result, noises are produced in the pulse forming the pulse width modulation signal PWM, the output of the phototransistor (not shown) and the pulse of the transistor drive signal SG1. Because of the noise produced, the upstream transistor Tr1 and the downstream transistor Tr2 do not switch smoothly.

SUMMARY OF THE INVENTION

The present invention solves the above-specified problems of the motor drive device of the prior art.

A further object of the invention is to provide a motor drive device capable of smoothly switching transistors of an inverter while preventing a control unit from being influenced by noise.

In order to achieve the above-specified objects a motor drive device is provided. The motor drive device comprises a substrate, a control unit, insulation means packaged over the substrate, a gate drive circuit packaged over the substrate and connected through the insulation means with the control unit, and an inverter. The control unit generates a pulse width modulation signal. The gate drive circuit generates a transistor drive signal in response to the pulse width modulation signal coming from the control unit. The inverter includes a plurality of transistors for generating a phase current by turning ON/OFF the transistors in response to the transistor drive signal coming from the gate driver circuit.

A wiring pattern and a substrate ground are formed at the side of the substrate in close proximity to the control unit. The wiring pattern is formed at the side of the substrate in close proximity to the gate drive circuit.

Further objects, details and advantages of the invention will be apparent from the following detailed description, when read in conjunction with the drawings.

DETAILED DESCRIPTION OF PREFERRED EMBODIMENTS

Figure 1:
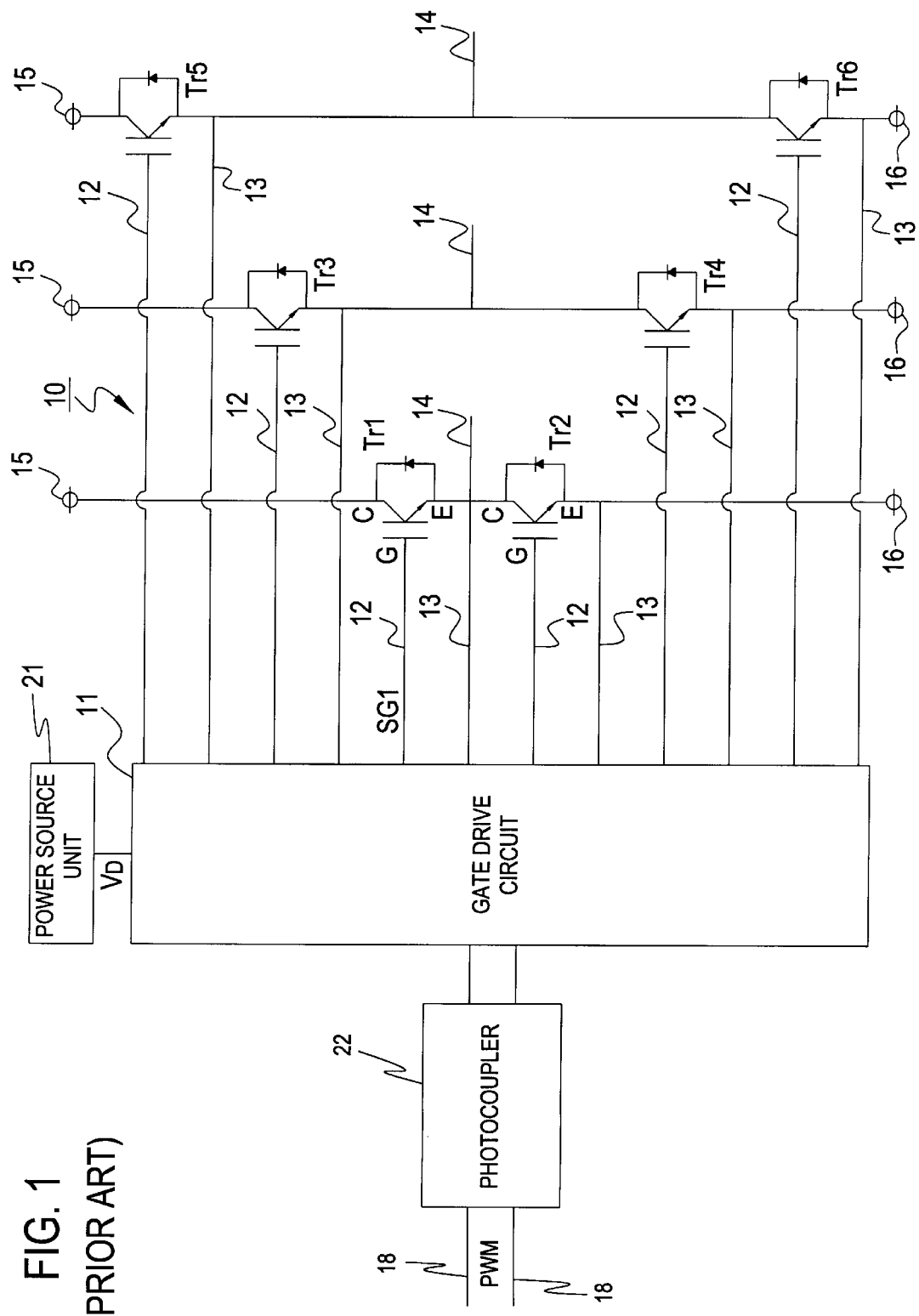
FIG. 1 is a circuit diagram showing an essential portion of a motor drive unit of the prior art.
Figure 2:
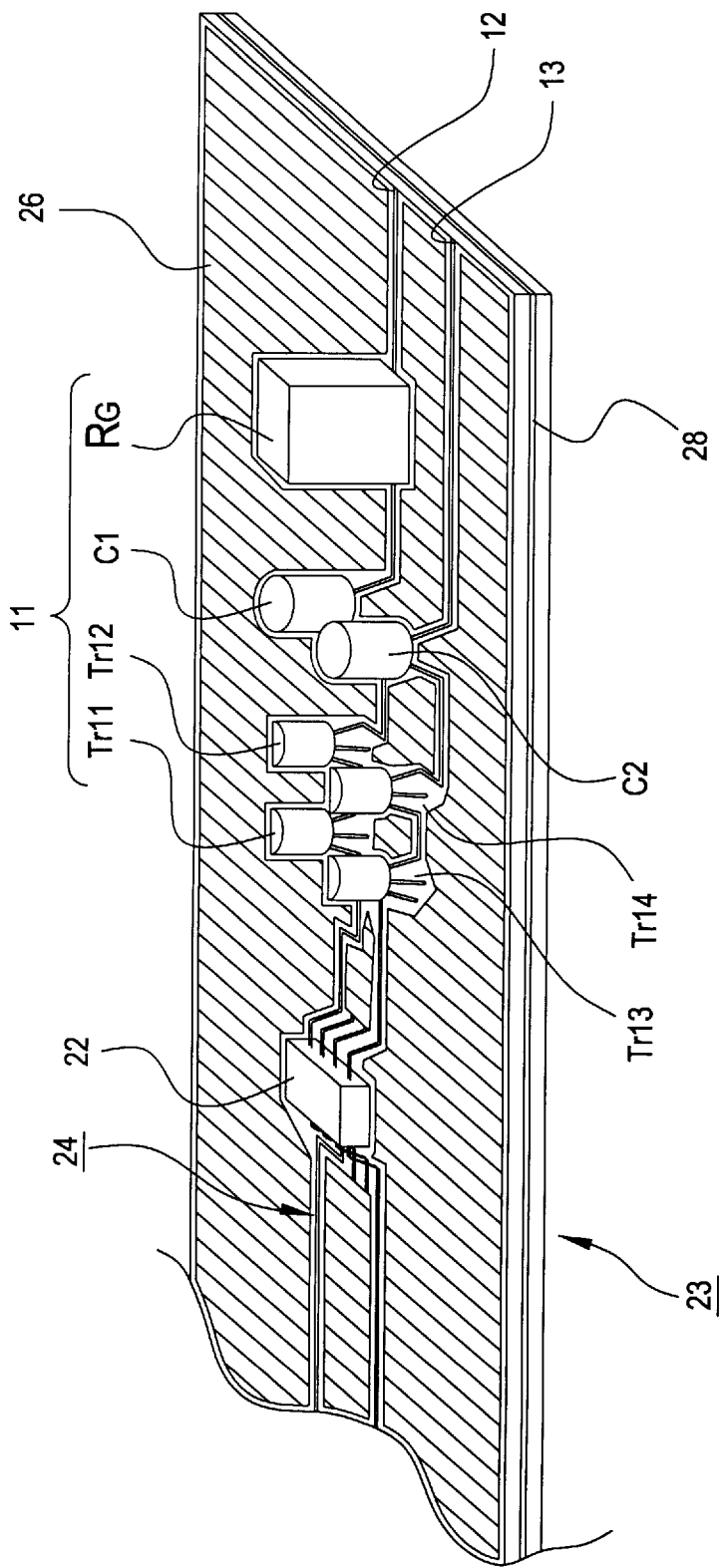
FIG. 2 is a perspective view showing a packaged state of a gate drive circuit in the motor drive unit of the prior art.
Figure 3:
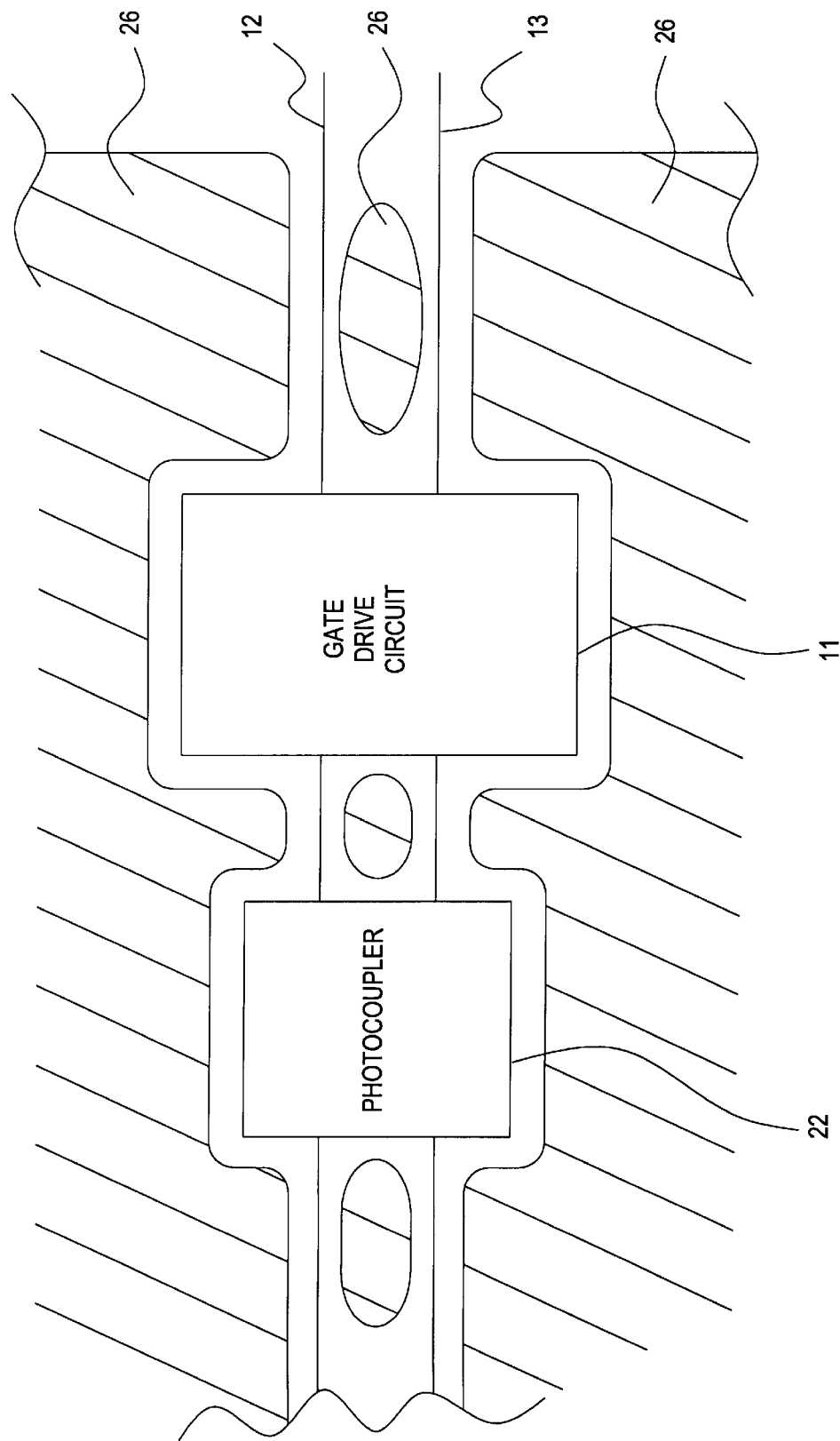
FIG. 3 is a top plan view showing the packaged state of the gate drive circuit in the motor drive unit of the prior art.
Figure 4:
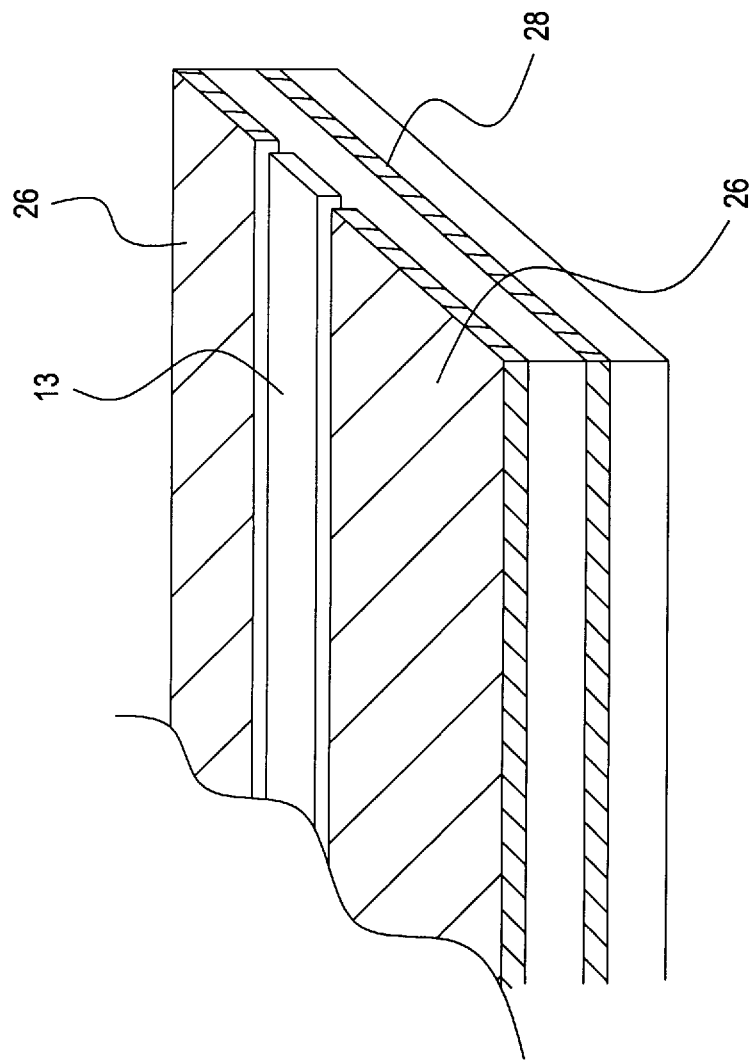
FIG. 4 is a perspective view showing an essential portion of the substrate in the motor drive unit of the prior art.
Figure 5:
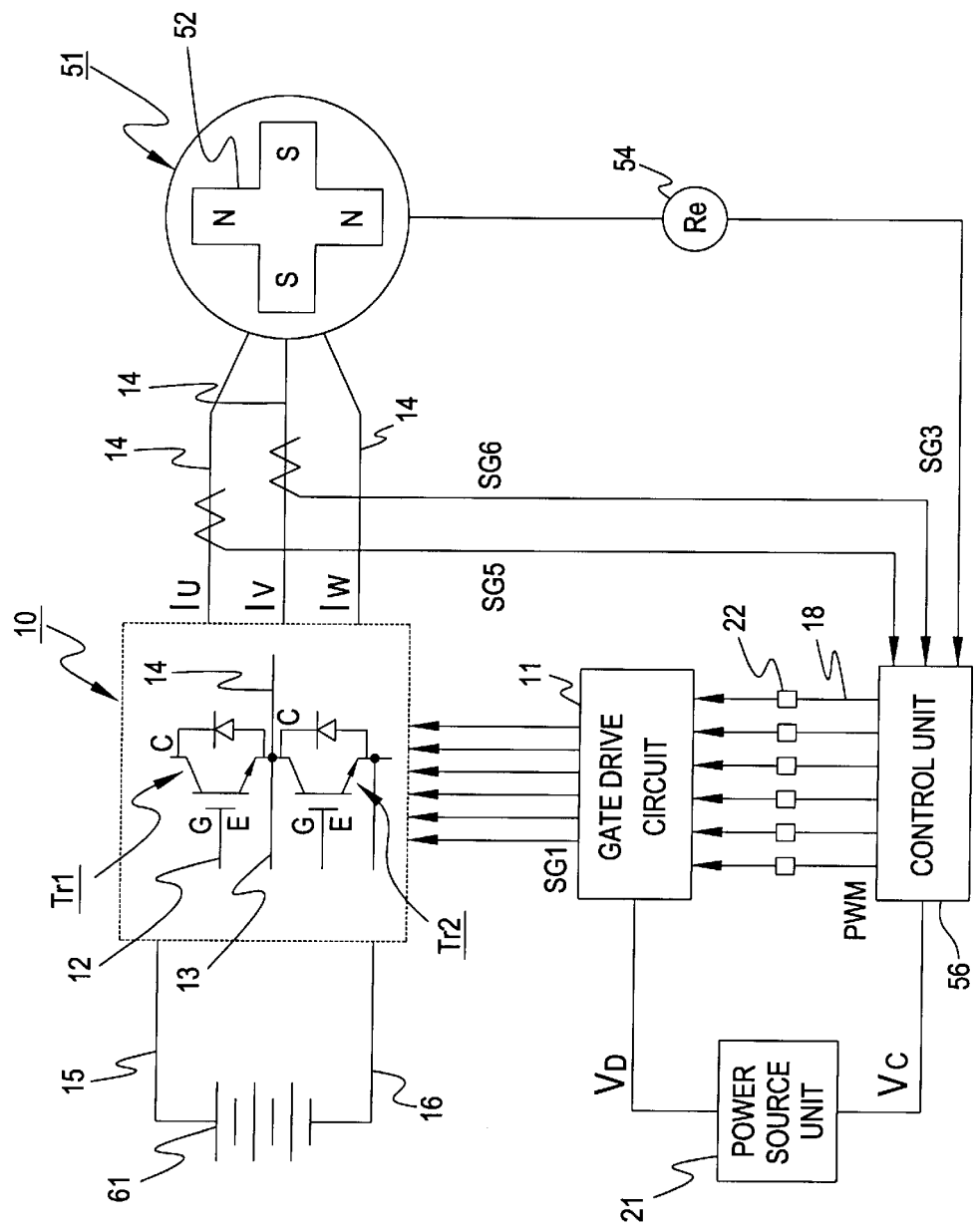
FIG. 5 is a diagram showing a control circuit of a motor drive device according to an embodiment of the invention.

FIG. 5 is a diagram showing a control circuit of a motor drive device according to an embodiment of the invention. A motor 51 is constructed of a rotor 52 and a stator coil (not shown). A resolver (Re) 54 for detecting the position of the magnetic pole of the rotor 52 is also provided. The resolver 54 generates a magnetic pole position signal SG3 and feeds it to a control unit 56.

The control unit 56 includes current command value generating means, current comparing means, pulse width modulation signal generating means, and triangular-wave generating means. The current command value generating means responds to a torque command value to generate a three-phase sinusoidal signal composed of U-phase ($I_u$), V-phase ($I_v$), and W-phase ($I_w$). Each phase corresponds to the position of the magnetic pole of the rotor 52, as provided by the magnetic pole position signal SG3. The current command value generating means sends the sinusoidal signal, as a current command value, to the current comparing means.

The current comparing means compares the current command value and phase current signals SG5 and SG6, as fed back from the motor 51. The current comparing means then inputs the difference between the current command value and phase current signals SG5 and SG6 to the pulse width modulation signal generating means. The pulse width modulation signal generating means then compares the inputted difference and the reference triangular-wave from the triangular-wave generating means. The pulse width modulation signal generating means then generates and sends the three-phase pulse width modulation signal PWM, having the output pulse width corresponding to the current command value, to a gate drive circuit 11.

The gate drive circuit 11 generates a transistor drive signal SG1 in response to the pulse width modulation signal PWM and sends it to an inverter 10. In order to generate the three-phase currents $I_u$, $I_v$ and $I_w$, the inverter 10 is equipped with three transistor pairs in which an upstream transistor Tr1 and a downstream transistor Tr2 are connected in series. The upstream transistor Tr1 and downstream transistor Tr2 are turned ON only while the transistor drive signal SG1 is ON. When the upstream transistor Tr1 and downstream transistor Tr2 are turned ON, they generate and feed the three-phase phase signals $I_u$, $I_v$ and $I_w$ to the motor 51.

A power source unit 21 for applying a control voltage and a drive voltage $V_D$ to the control unit 56 and the gate drive circuit 11, respectively, is also provided. The power source unit 21 is connected individually with the control unit 56 and the gate drive circuit 11.

A gate G and a gate line i2, a collector C and a power source line 15, an emitter E, and an emitter line 13 and a phase winding 14 are connected with each other in the upstream transistor Tr1. The gate G and the gate line 12, the collector C and the phase winding 14, the emitter E, the emitter line 13 and a negative polarity power source line 16 are connected with each other in the downstream transistor Tr2. The phase winding 14 and the motor 51, and the positive polarity power source line 15 and the negative polarity power source line 16 are individually connected with a battery 61.

The inverter 10 is driven by the gate drive circuit 11. The gate drive circuit 11 and the individual gates G of the upstream transistor Tr1 and downstream transistor Tr2 are connected with each other by their respective gate lines 12. This configuration permits the individual transistor drive signals SG1, as generated by the gate drive circuit 11, to be inputted to the individual gates G. In this case, both the upstream transistor Tr1 and the downstream transistor Tr2 are turned ON when the transistor drive signals SG1 are set to a high level. Similarly, both the upstream transistor Tr1 and the downstream transistor Tr2 are turned OFF when the transistor drive signals SG1 are set to a low level.

The positive polarity phase currents $I_u$, $I_v$ and $I_w$ are fed to the motor 51 through the phase wiring 14 when the upstream transistor Tr1 is turned ON and the downstream transistor Tr2 is turned OFF. The phase signals $I_u$, $I_v$ and $I_w$ are fed to the motor 51 when the upstream transistor Trl is turned OFF and the downstream transistor Tr2 is turned ON.

Because the drive voltage $V_D$ is usually made to take 15 [V], the transistor drive voltage SG1 takes 15 [V] at the high level and −15 [V] at the low level. Because the control voltage $V_C$ is set to 5 [V], the pulse width modulation signal PWM takes a voltage of 5 [V] at the high level and the voltage of 0 [V] at the low level. As a result, the pulse width modulation signal PWM is easily influenced by the drive voltage $V_D$.

A photocoupler 22 acting as insulation means for insulating the control unit 56 and the gate drive circuit 11 is located between the control unit 56 and the gate drive circuit 11. The photocoupler 22 is composed of a photodiode and a phototransistor (not shown).

Figure 6:
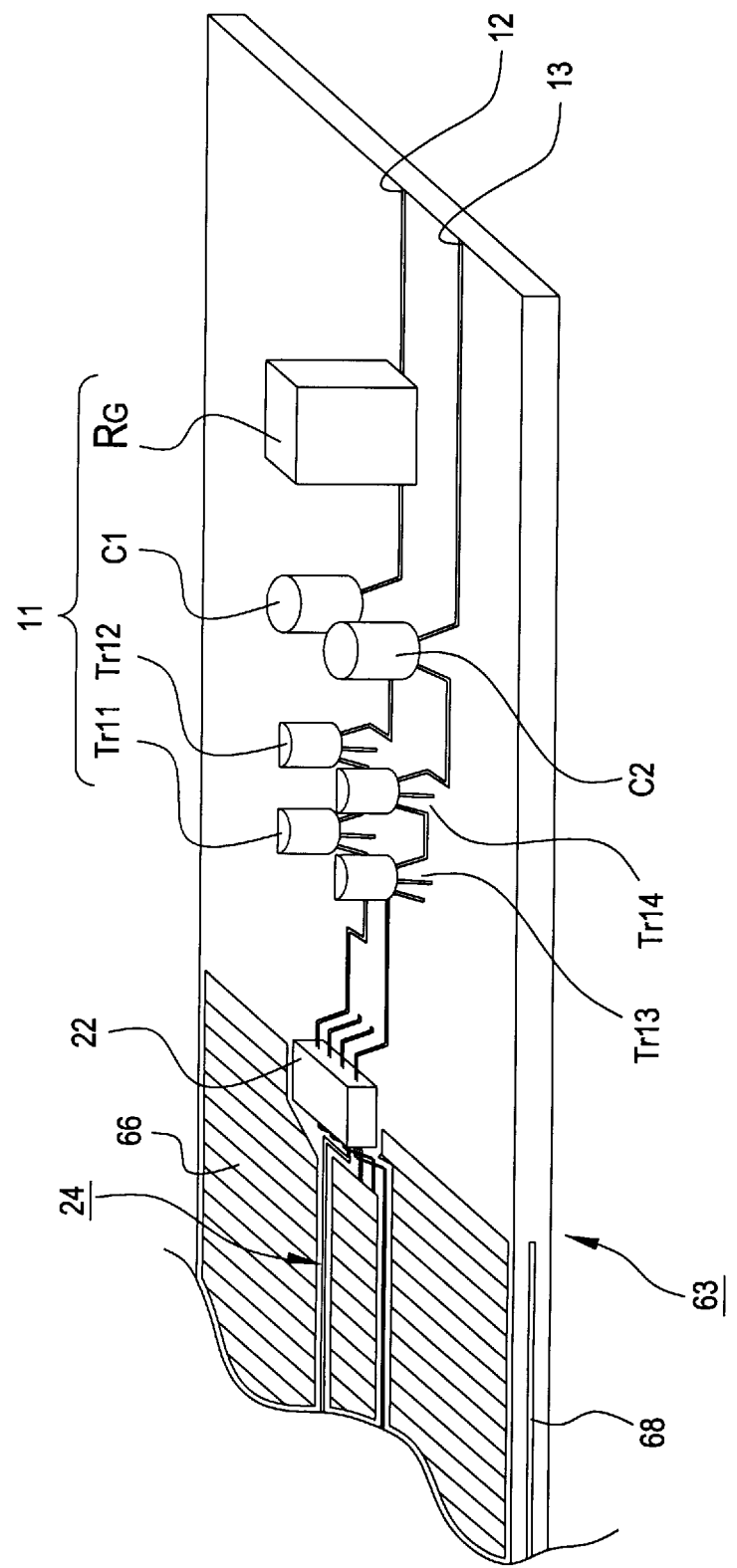
FIG. 6 is a perspective view showing a packaged state of a gate drive circuit according to an embodiment of the invention.
Figure 7:
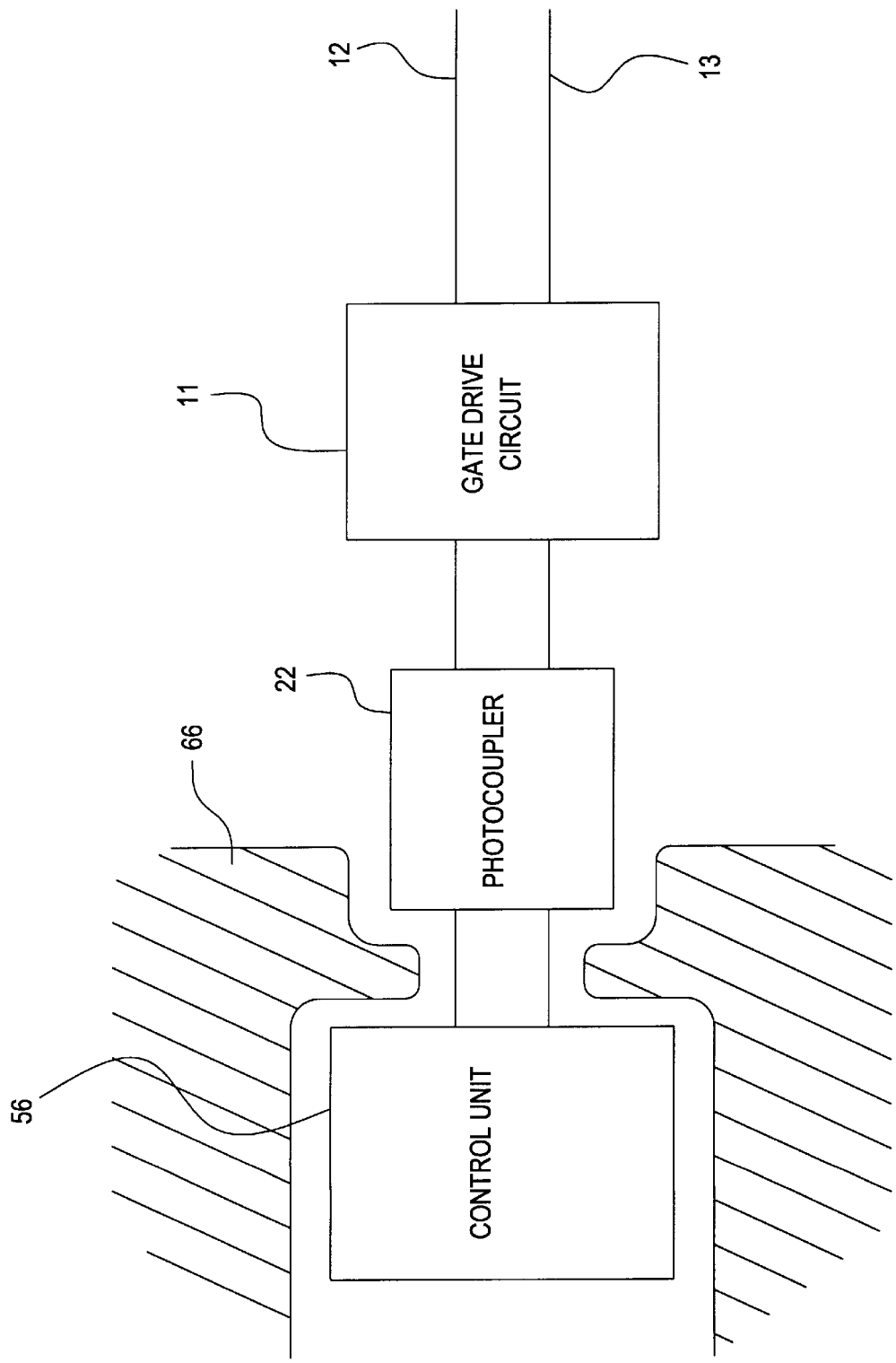
FIG. 7 is a top plan view showing a packaged state of a gate drive circuit in the embodiment of the invention.
Figure 8:
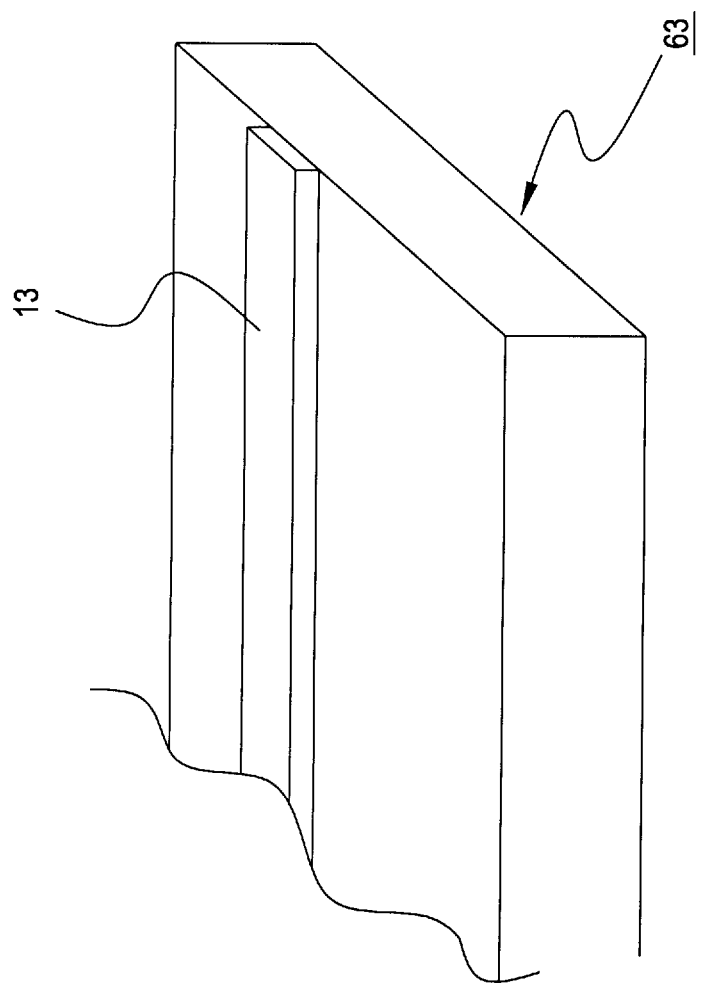
FIG. 8 is a perspective view showing a portion of the substrate in the embodiment of the invention.

FIG. 6 is a perspective view showing a packaged state of a gate drive circuit according to an embodiment of the invention. FIG. 7 is a top plan view showing a packaged state of a gate drive circuit. FIG. 8 is a perspective view showing a portion of the substrate in the embodiment of the invention.

In these figures, the gate drive circuit 11 includes transistors Tr11 and Tr12, an electrolytic capacitor C1 and a gate resistor $R_G$. The transistors Tr11 and Tr12, electrolytic capacitor C1 and gate resistor $R_G$ are arranged along the gate line 12. The gate drive circuit 11 further includes transistors Tr13 and Tr14 and an electrolytic capacitor C2. The transistors Tr13 and Tr14 and electrolytic capacitor C2 are arranged along the emitter line 13. The transistors Tr11 and Tr13 are connected through the photocoupler 22 with the control unit 56.

The control unit 56, gate drive circuit 11 and power source unit 21 (as shown in FIG. 5) are packaged over a common substrate 63 and are connected through a wiring pattern 24. The wiring pattern 24 is composed of the gate line 12 and the emitter line 13 and is formed on the substrate 63.

A substrate ground 66 is provided to eliminate noise produced in the pulse width modulation signal which is fed from the control unit 56 to the gate drive circuit 11. The substrate ground 66 is formed of a solid pattern on the surface of the substrate 63 at the side close to the control unit 56 and in the portion having no wiring pattern 24. The substrate ground is grounded to the earth by connecting it with the casing (not shown). A substrate pattern 68 is formed of a solid pattern inside of the substrate at the side closer to the control unit 56 and in the portion not having a wiring pattern (not shown). The substrate pattern 68 is grounded to the earth by connecting it with the casing (not shown).

When the upstream transistor Tr1 and the downstream transistor Tr2 are separately turned ON/OFF, positive and negative potentials at a level corresponding to the battery voltage are alternately established between the gates G and the emitters E. This causes the potential of the emitter line 13 to fluctuate.

The wiring pattern 24 is formed on the surface of the substrate 63 at the side close to the gate drive circuit 11. The wiring pattern (not shown) is also formed on the inside of the substrate 63 at the side close to the gate drive circuit 11. The substrate ground is not formed around the emitter line 13 on the surface and inside of the substrate 63 at the side close to a gate drive circuit 11. Using this configuration, the capacitor effect is not produced even as the potentials of the emitter lines 13 fluctuate.

As a result, it is possible to prevent any noise from being produced in the pulse forming the pulse width modulation signal, the output of the phototransistor of the photocoupler 22, and the pulse of the transistor drive sign al SG1. As a further result, the upstream transistor Tr1 and the downstream transistor Tr2 can be smoothly switched. It is also possible to prevent the control unit 56 from being influenced by noise.

In this embodiment, the pulse width modulation signal is sent through the insulation means to the gate drive circuit. In response to the pulse width modulation signal coming from the control unit, the gate drive circuit generates and sends the transistor drive signal to the inverter. In response to the transistor drive signal coming from the gate drive circuit, the inverter turns ON/OFF the transistors selectively to generate the phase current.

Even if the potential of the wiring pattern at the side close to the gate drive circuit are selectively turned ON/OFF, no capacitor effect is produced even as the potential of the wiring pattern fluctuates. This happens because no substrate ground is formed around the wiring pattern. As a result, it is possible to prevent any noise from being produced in the pulse forming the pulse width modulation signal, the output of the insulation means, and the pulse of the transistor drive signal. Thus, it is possible to switch the transistors smoothly.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A motor drive device comprising:

a substrate;

a control unit packaged over said substrate for generating a pulse width modulation signal;

insulation means packaged over said substrate;

a gate drive circuit packaged over said substrate and connected through said insulation means with said control unit for generating a transistor drive signal in response to the pulse width modulation signal coming from said control unit; and an inverter including a plurality of transistors for generating a phase current by turning ON/OFF said transistors in response to the transistor drive signal coming from said gate driver circuit, wherein a wiring pattern and a substrate ground are formed at the side of said substrate closer to said control unit than said insulation means whereas only the wiring pattern is formed at the side of said substrate closer to said gate drive circuit than said insulation means.

2. A motor drive device according to claim 1, wherein said insulation means is a photocoupler.

3. A motor driving device according to claim 1, wherein the control unit includes current command value generating means, current comparing means, pulse width modulation signal generating means, and triangular wave command value generating means.

4. A motor driving device according to claim 3, wherein the current command value generating means responds to a torque command value.

5. A motor driving device according to claim 1, wherein the plurality of transistors are an upstream transistor and a downstream transistor.

6. A motor driving device according to claim 5, wherein the upstream transistor includes a gate, a gate line, a collector, an emitter, an emitter line and a phase winding connected with each other.

7. A motor driving device according to claim 5, wherein the downstream transistor includes a gate, a gate line, a collector, an emitter, an emitter line and a phase winding connected with each other.

8. A motor driving device according to claim 5, wherein the upstream transistor and the downstream transistor are connected to each other by a gate line.

9. A motor driving device according to claim 1, wherein the gate drive circuit includes a first plurality of transistors, a first electrolytic capacitor and a gate resistor arranged along a gate line; and a second plurality of transistors and a second electrolytic capacitor arranged along an emitter line.

10. A motor driving device according to claim 1, wherein the control unit and the gate drive circuit are packaged over the substrate and through the wiring pattern, wherein the wiring pattern includes a gate line and an emitter line.

11. A motor driving device according to claim 1, wherein at least one of the plurality of transistors is connected through a photocoupler with the control unit.

12. A motor drive device according to claim 11, wherein the wiring pattern is formed over the substrate in close proximity to the gate drive circuit.

\* \* \* \* \*